United States Patent
Figueroa et al.

(12)

(10) Patent No.: US 6,556,404 B2
(45) Date of Patent: Apr. 29, 2003

(54) SELF POWERED COOLING FAN AND METHOD

(75) Inventors: Alberto Anibal Figueroa, Southington, CT (US); Farshid Attarian, Canton, CT (US); Joseph Criniti, New Britain, CT (US); Javier Ignacio Larranaga, Bristol, CT (US); James Robert Scanlon, South Windsor, CT (US)

(73) Assignee: General Electric Company, Schenectady, NY (US)

( * ) Notice: Subject to any disclaimer, the term of this patent is extended or adjusted under 35 U.S.C. 154(b) by 153 days.

(21) Appl. No.: 09/681,650

(22) Filed: May 16, 2001

(65) Prior Publication Data

US 2002/0171986 A1 Nov. 21, 2002

(51) Int. Cl.[7] .................................................. H02H 3/00
(52) U.S. Cl. ........................ 361/93.1; 361/103; 361/115
(58) Field of Search .................................. 361/103, 115, 361/93.1, 90, 78, 18, 106

(56) References Cited

U.S. PATENT DOCUMENTS

| | | | | |
|---|---|---|---|---|
| 4,035,692 A | * | 7/1977 | Luy et al. ..................... | 361/103 |
| 4,135,101 A | * | 1/1979 | Young et al. .................. | 307/39 |

* cited by examiner

*Primary Examiner*—Stephen W. Jackson
(74) *Attorney, Agent, or Firm*—Cantor Colburn LLP

(57) ABSTRACT

Electrical distribution equipment generally includes a housing defining an enclosed space and a conductor in the enclosed space. A current transformer utilizing current in the conductor induces current in a secondary winding thereof, and a fan assembly is electrically connected to the secondary winding. The fan assembly includes a fan motor in driving relation to a fan.

21 Claims, 2 Drawing Sheets

SELF POWERED COOLING FAN AND METHOD

BACKGROUND OF INVENTION

The present invention is directed towards electric power handling equipment such as circuit breakers, switchgear, panel boards, motor control centers, busways, etc. More particularly, the present invention is directed toward a system and method for cooling such electric power handling equipment.

Most electric power distribution equipment is rated based on its maximum current carrying capacity. The method of determining this rating is established by industry standards. For example, internal temperature during operation is one of the parameters that may limit the rating a particular piece of equipment is given. Another parameter is the temperature at the customer connection point. In many cases, the physical characteristics of a particular piece of equipment or component thereof would allow higher interruption levels but because of the operating temperature characteristics, the rated level of interruption has to be kept lower.

Because the Underwriter's Laboratories (UL) code prohibits directly powering internal components with line or load side power, simply adding a fan or cooling unit to the equipment is not always an available option, particularly with circuit breakers.

The use of current transformers (CTs) for sensing current and providing power to controller electronics has been known. However, it has not heretofore been known to use a CT to produce sufficient electricity to power a cooling fan in order to increase the rating of the electrical device by reducing the internal temperature.

SUMMARY OF INVENTION

The above-discussed and other drawbacks and deficiencies of electrical distribution equipment that generally includes a housing defining an enclosed space and a conductor in the enclosed space are overcome or alleviated by a current transformer utilizing current in the conductor induces current in a secondary winding thereof, and a fan assembly is electrically connected to the secondary winding. The fan assembly includes a fan motor in driving relation to a fan.

The above-discussed and other features arid advantages of the present invention will be appreciated and understood by those skilled in the art from the following detailed description and drawings.

BRIEF DESCRIPTION OF DRAWINGS

Referring to the Figures wherein like elements are numbered alike in the several FIGURES.

DETAILED DESCRIPTION

Figure 1:
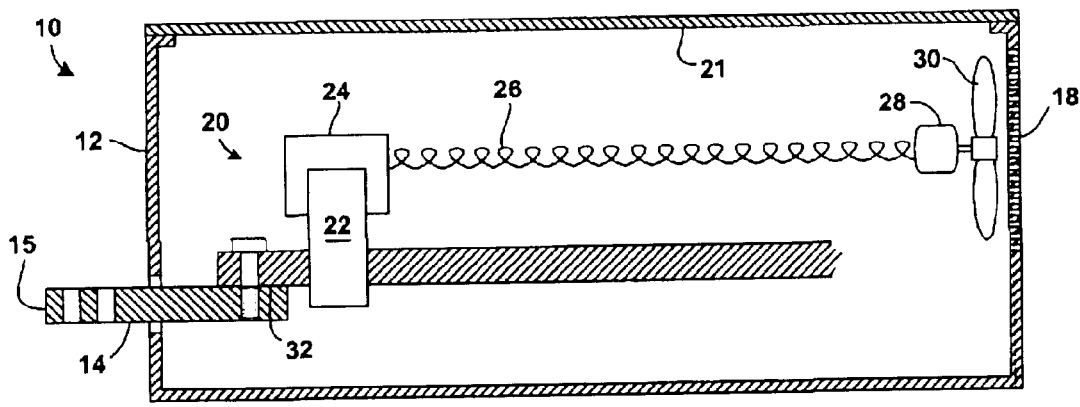
FIG. 1 is a schematic representation of electrical distribution equipment having a self powered fan implementation.

Referring to FIG. 1, electrical distribution equipment 10 generically represents a busway, switchgear, motor control center, air circuit breaker, molded case circuit breaker, panel board, switchboard, lighting panel, load center, conducting cables, component thereof, and/or other power transmission, electrical distribution, and/or electrical protection device. Electrical distribution equipment 10 includes a housing 12 enclosing an electrical conductor 16. A cover 21 encloses the space inside housing 12, potentially trapping heat. Housing 12 and cover 21 may be made of molded plastic, metal, other material, or combinations thereof. Housing 12 further includes a line side terminal 15 and a load side terminal (not shown). There may be an internal connection 32 or other pressure contacts in housing 12 connecting conductor 16 to other components such as line strap 14. These contact points generally constitute areas of increased electrical resistance and therefore heat production. Ventilation holes 18 are provided in housing 12 to admit or expel air under the influence of cooling fan 30. Internal airflow structures (not shown) such as baffles and/or vent holes may be provided for directing more airflow over areas likely to generate more heat to maintain lower internal temperatures. Secondary fans (not shown) may also be provided where advantageous.

Although only one conductor 16 is shown, there may be a plurality of conductors 16, e.g., one for each phase of current in the distribution circuit. Housing 12 may include a single cooling fan 30 to cool all conductors in the housing 12, or a separate cooling fan 30 for each conductor in housing 12. For example, separate fans may be advantageous where internal walls or other internal structure such as channels, recesses, cassettes, etc., separate the conductors.

Transformer 20 includes a transformer core 22 disposed around conductor 16. A secondary winding 24 is wound onto transformer core 22. Leads 26 extend from secondary winding 24 to fan motor 28, which in turn drive cooling fan 30. Transformer 20 is designed to provide sufficient power to drive fan motor 28 when the current in conductor 16 reaches a predetermined level. For example, if unacceptable heat is generated in housing 12 when conductor 16 carries 80% of the target rating for equipment 10, transformer 20 must be designed to provide sufficient current to fan motor 28 to drive fan 30 to dissipate that heat when the current in conductor 16 reaches some selected threshold, such as 70% or 75% of the target rating.

Fan motor 28 may be designed to directly utilize the alternating current induced in the secondary winding of transformer 20, or it may be a DC motor with a rectifier (not shown). An advantage to using a DC motor is that as the current in conductor 16 increases, causing more heat to be generated, the DC motor will speed up, increasing the ventilation and the cooling effects thereof.

Figure 2:
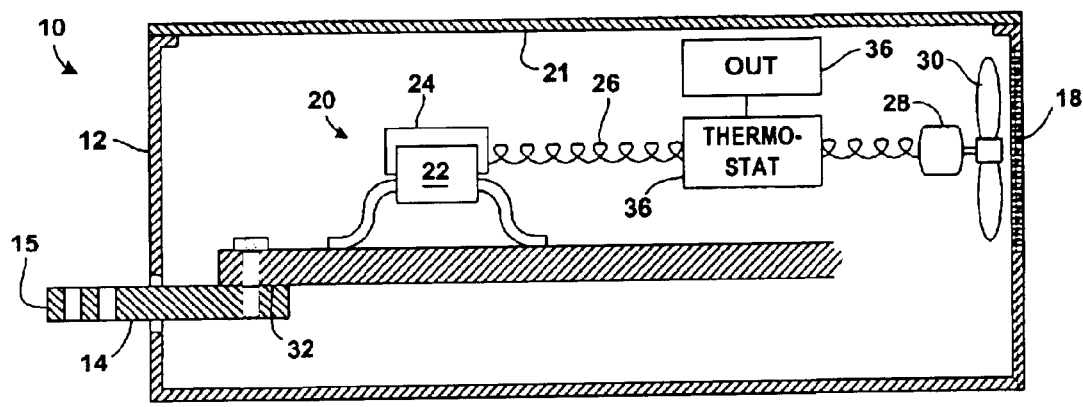
FIG. 2 is schematic representation of the electrical distribution equipment of FIG. 1 having another implementation of a self powered fan arrangement.

An alternate embodiment is represented schematically in FIG. 2. This embodiment is similar to the embodiment discussed above with reference to FIG. 1 except that here, transformer 20 is positioned on a bridge 17 that carries only a small fraction of the current in conductor 16. A current bridge may be particularly advantageous in high capacity equipment that include large internal conductors, which would otherwise require rather large transformer cores to extend around the large conductors. The embodiment represented in FIG. 2, rather than providing power directly from transformer 20 to fan motor 28, power is provided to a thermostat 34 which remains off below a first threshold. When the temperature inside housing 12 increases to a point over the first threshold, thermostat 34 powers up fan motor 28. When the temperature inside housing 12 increases to a point over a second threshold, thermostat 34 generates an output signal to output 36. Output 36 may be an alarm, such as a noise or light generating element, or it may be send a trip signal or shut-off signal, causing the current in conductor 16 to be shut off. Where electrical distribution equipment 10 is a circuit breaker, Thermostat 34 may be incorporated into an electronic trip unit for electronically controlling fan 30 in response to a sensed or predicted internal temperature, and for tripping the circuit breaker in response to the temperature reaching an upper threshold.

Figure 3:
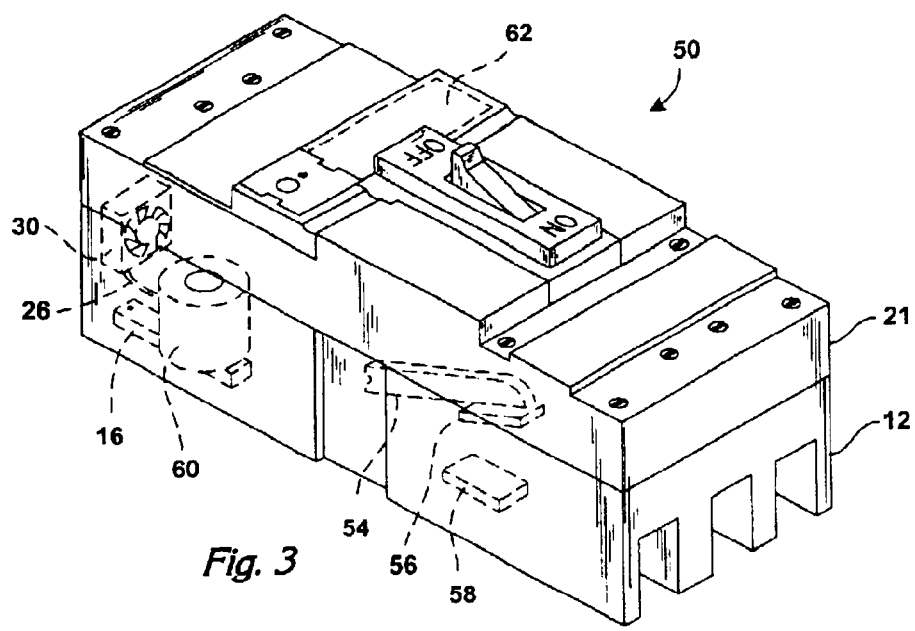
FIG. 3 is a perspective view of an exemplary circuit breaker having a self powered-fan implementation.

FIG. 3 shows an exemplary implementation of a cooling fan in a circuit breaker 50. Circuit breaker 50, shown herein by way of example as a molded case circuit breaker, includes housing 12 and cover 21, together defining an enclosed space. Circuit breaker 50 is a three-phase circuit breaker, and therefore includes three sets of separable contacts. However, only one phase is shown here for illustration purposes. Of course, the invention may be incorporated into circuit breakers and other equipment having a fewer or greater number of phase conductors. Handle 53 is connected via an operating mechanism (not shown) to movable contact arm 54. Movable contact arm 54 carries at least one movable contact 56 (only one shown) which mates with an opposing fixed contact 58. When handle 53 is in the OFF position or when circuit breaker 50 trips, movable and fixed contacts 56 and 58 are separated. When handle 53 is in the ON position, movable and fixed contacts 56 and 58 are in contact with each other, completing a connection between load and line side terminals (not shown) for that phase.

Positioned in series with each set of contacts is a conductor 16, which includes a transformer 60 positioned therearound for inducing a voltage in the secondary winding. Secondary winding of transformer 60 are connected to electronic trip unit 62 via leads 26 for powering trip unit 62 and for automatic monitoring of the current levels in each of the phases, i.e., so that the circuit breaker 50 can be tripped if the current in conductor 16 exceeds the pre-selected time/current limits. Trip unit 62 detects or otherwise determines the internal temperature of circuit breaker 50. When the internal temperature increases above a first threshold fan 30 is turned on. When the internal temperature of circuit breaker 50 increases above a second threshold, trip unit 62 causes circuit breaker 50 to trip, thereby shutting off electrical flow through circuit breaker 50.

Figure 4:
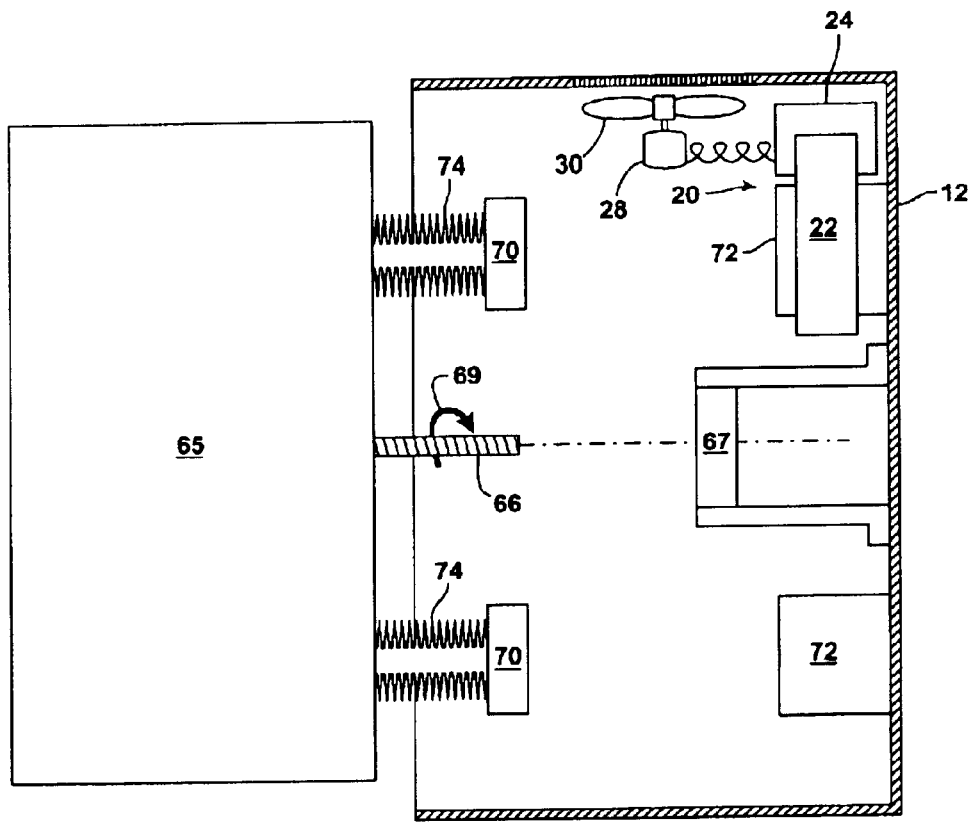
FIG. 4 is a schematic representation of a draw-out circuit breaker having a self-powered. fan implementation.

FIG. 4 shows another exemplary implementation in which a self-powered fan 30 is disposed in a cabinet for a draw-out circuit breaker 65. Such draw-out circuit breakers are rated up to 100 KAmps or more. Draw-out circuit breaker 65 is mounted on rails (not shown) for sliding into and out of housing 12. Draw-out circuit breaker 65 includes two electrical connectors 70 for each phase of current controlled by draw-out circuit breaker 65. Connectors 70 are shown schematically as simple rectangles, but may include large spring-loaded grippers for providing a good electrical connection to electrical connectors 72 mounted to housing 12. Jack screw 66 engages block 67 and is turned in the direction of arrow 69 either manually by a crank (not shown) or by an electric motor (not shown) to force connectors 70 and connectors 72 to mate. Even with such oversized connectors, a large amount of heat is generated at the contact area due to contact resistance, which requires extensive cooling fins 74 to dissipate.

To assist the dissipation of built-up heat, a transformer 20 is provided around one or more of connectors 72 to induce a current in secondary winding 24, thus providing electricity to fan motor 28, driving fan 30. With the addition of fan 30, the rating of draw-out circuit breaker 65 can be increased, the size of connectors 70 and 72 can be reduced, and/or the number of cooling fins 74 can be reduced.

As noted above, the system and method disclosed herein can be applied to any electricity distribution component where heat build-up is a factor that can limit the maximum allowable current. The system and method are particularly advantageous where there is no readily available source of electricity and/or the UL Code or other industry practices prohibit directly utilizing the electricity available in the conductor.

ExampleA busbar having a current bridge arrangement with a CT on the bridge was placed in an enclosure. The CT was utilized to power a fan assembly arranged to provide ventilation through the enclosure to cool the busbar. A current of approximately 660 Amps was passed through the busbar for one hour, which induced sufficient current in the secondary winding of the CT to drive the fan. At thirty second intervals, temperature measurements inside the housing were made as well as ambient temperature outside the housing. The test was run several times with the fan "ON" and with the fan "OFF".

Figure 5:
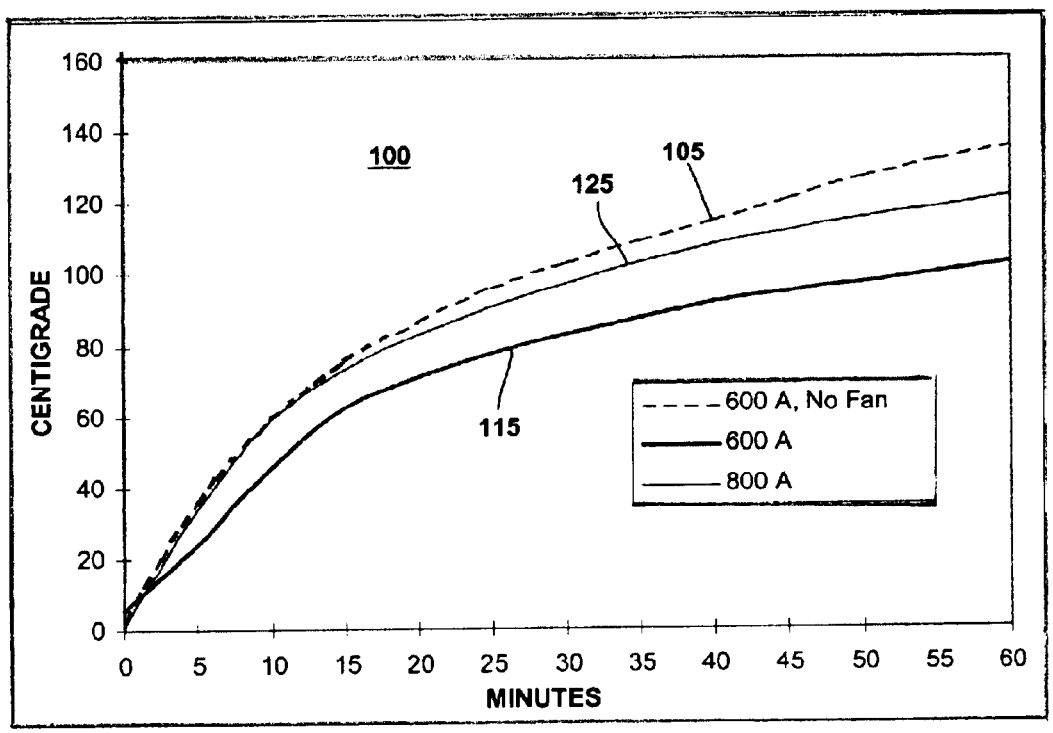
FIG. 5 is a line graph showing experimental results demonstrating the effectiveness of a self-powered fan in cooling electrical distribution equipment.

The line graph of FIG. 5 charting the difference between the internal and ambient temperatures provides typical results. In a first run, Curve 105 shows the temperature increase inside the housing where a steady current of about 600 Amps was passed through the busbar and the fan was disconnected. Curve 115 shows the temperature increase inside the housing during a second run wherein a steady current. of about 600 Amps was passed through the busbar with the fan assembly connected to the CT. Here, the temperature differential remained approximately 30% below the temperature differential where the fan is disconnected. In a third run, the current passing through the busbar was increased to approximately 800 Amps, and with the fan connected, the temperature differential did not increase above the level recorded in run 1 with the fan shut off at a lower current level.

This demonstrates the feasibility of increasing the rating of electrical equipment by adding a self-powered fan. It is particularly noteworthy that, although the current level was increased from 600 Amps with no fan to 800 Amps with a fan, the temperature differential increase inside the enclosure was reduced. Thus, if the enclosure without a fan should be given a rating of 600 Amps, that rating can be increased to 800 Amps by merely adding a self-powered cooling fan as described.

While preferred embodiments have been shown and described various modifications and substitutions may be made thereto without departing from the spirit limitation and scope of the invention. Accordingly, it is to be understood that the present invention has been described by way of illustration and not limited to the illustrative embodiments.

What is claimed is:

1. A method of increasing a rating of electrical distribution equipment, comprising:

inducing a voltage in a secondary winding of a transformer using current flow of a conductor in said electrical distribution equipment;

electrically connecting a fan assembly to said secondary winding, said fan assembly comprising a fan motor and a fan; and positioning said fan assembly adjacent a vent formed in a housing of said electrical distribution equipment.

2. The method of claim 1, said fan motor being a DC motor and said fan assembly further comprising a rectifier, said electrically connecting includes rectifying said voltage to a DC voltage, and passing said DC voltage to said fan motor.

3. The method of claim 1 wherein said inducing, said electrically connecting, and said positioning is performed for each phase of current handled by said electrical distribution equipment.

4. The method of claim 1 wherein said electrical distribution equipment comprises a circuit breaker, said method further comprising sensing an internal temperature and tripping said circuit breaker if said internal temperature exceeds a selected threshold.

5. The method of claim 1 wherein said inducing includes disposing said transformer around said conductor.

6. The method of claim 1 wherein said inducing includes diverting a portion of the current in said conductor in a current bridge, and disposing said transformer around said current bridge.

7. The method of claim 1 wherein said inducing includes selecting a transformer that generates sufficient electricity to drive said fan assembly when current in said conductor reaches a selected percentage of a rating of said electrical distribution equipment.

8. The method of claim 7 wherein said selected percentage is between 65% and 90%.

9. Electrical distribution equipment comprising:
   a housing defining an enclosed space;
   a conductor in said enclosed space;
   a current transformer utilizing current in said conductor to induce current in a secondary winding;
   a fan assembly electrically connected to said secondary winding, said fan assembly including a fan motor in driving, relation to a fan.

10. The electrical distribution equipment set forth in claim 9 wherein said fan assembly includes a rectifier and said motor comprises a DC motor driving said fan.

11. The electrical distribution equipment set forth in claim 10 wherein said conductor is one of a plurality of conductors, said plurality comprising a conductor for each phase of a multi-phase power supply.

12. The electrical distribution equipment set forth in claim 11 wherein said current transformer is one of a plurality of current transformers, said plurality of current transformers comprising a current transformer for each of said plurality of conductors.

13. The electrical distribution equipment set forth in claim 12 wherein said fan assembly is one of a plurality of fan assemblies, said plurality of fan assemblies comprising a fan assembly for each of said plurality of current transformers.

14. The electrical distribution equipment set forth in claim 9 wherein said current transformer is positioned around said conductor.

15. The electrical distribution equipment set forth in claim 9 further comprising a current bridge connected in parallel with said conductor, said current transformer being positioned on said current bridge.

16. The electrical distribution equipment set forth in claim 9 further comprising:
   a fixed contact;
   a contact arm having a movable contact, said contact arm movable between a closed position in which said fixed contact is in contact with said movable contact and an open position in which said fixed contact and said movable contacts are separated; and
   said contact arm and fixed contact being connected in series with said conductor.

17. The electrical distribution equipment set forth in claim 16 further comprising a handle for moving said contact arm between said open position and said closed position.

18. The electrical distribution equipment set forth in claim 17 wherein said electrical distribution equipment is a circuit breaker and further comprises a trip unit which, in response to an over-current condition, trips said circuit breaker by causing said movable arm to move from said closed position to said open position.

19. The electrical distribution equipment set forth in claim 18 wherein said trip unit determines an over-current condition by monitoring a voltage in said secondary winding.

20. The electrical distribution equipment set forth in claim 19, said fan assembly further comprising a thermostat for powering said fan motor only when a temperature in said circuit breaker exceeds a first threshold, said thermostat further causes said circuit breaker to trip when said temperature exceeds a second threshold.

21. The electrical distribution equipment set forth in claim 9, said fan assembly further comprising a thermostat for powering said fan motor only when a temperature in said circuit breaker exceeds a first threshold.

* * * * *